US008808808B2

(12) United States Patent
Xu et al.

(10) Patent No.: US 8,808,808 B2
(45) Date of Patent: Aug. 19, 2014

(54) METHOD FOR IMPRINT LITHOGRAPHY UTILIZING AN ADHESION PRIMER LAYER (75) Inventors: Frank Y. Xu, Round Rock, TX (US); Sidlgata V. Sreenivasan, Austin, TX (US); Edward Brian Fletcher, Austin, TX (US)

(73) Assignee: Molecular Imprints, Inc., Austin, TX (US)

( * ) Notice: Subject to any disclaimer, the term of this patent is extended or adjusted under 35 U.S.C. 154(b) by 642 days.

(21) Appl. No.: 11/734,542

(22) Filed: Apr. 12, 2007

(65) Prior Publication Data
US 2007/0212494 A1 Sep. 13, 2007

Related U.S. Application Data (63) Continuation-in-part of application No. 11/187,407, filed on Jul. 22, 2005, and a continuation-in-part of application No. 11/187,406, filed on Jul. 22, 2005.

(51) Int. Cl.
*B05D 1/36* (2006.01)
*B05D 7/00* (2006.01)

(52) U.S. Cl.
USPC ..... 427/407.1; 427/401; 427/402; 427/407.2; 427/419.1; 427/207.1; 427/419.5; 427/208; 427/208.8; 428/446; 428/447; 428/448; 428/457; 428/469; 428/461; 264/320; 430/313; 430/215

(58) Field of Classification Search
USPC .............. 427/401, 402, 407.1, 407.2, 419, 7, 427/207.1, 208, 208.8; 428/446, 447, 448, 428/457, 469, 461; 264/320; 430/313, 215
See application file for complete search history.

(56) References Cited

U.S. PATENT DOCUMENTS

| | | | |
|---|---|---|---|
| 3,498,827 A * | 3/1970 | Vanderbilt et al. | 428/35.9 |
| 3,810,874 A | 5/1974 | Mitsch et al. | |
| 4,251,277 A | 2/1981 | Martin | |
| 4,506,003 A | 3/1985 | Ruckert et al. | |
| 4,512,848 A | 4/1985 | Deckman et al. | |
| 4,614,667 A | 9/1986 | Larson et al. | |
| 4,617,238 A | 10/1986 | Crivello et al. | |
| 4,687,707 A | 8/1987 | Matsuo et al. | |
| 4,731,155 A | 3/1988 | Napoli et al. | |
| 4,826,943 A | 5/1989 | Ito et al. | |
| 4,848,911 A | 7/1989 | Uchida et al. | |
| 4,931,351 A | 6/1990 | McColgin et al. | |
| 4,959,252 A | 9/1990 | Bonnebat et al. | |
| 5,028,366 A | 7/1991 | Harakal et al. | |
| 5,028,511 A | 7/1991 | Choi | |
| 5,110,514 A | 5/1992 | Soane | |
| 5,148,037 A | 9/1992 | Suda et al. | |
| 5,149,592 A | 9/1992 | Wojnarowicz | |
| 5,151,754 A | 9/1992 | Ishibashi et al. | |
| 5,169,494 A | 12/1992 | Hashimoto et al. | |
| 5,206,983 A | 5/1993 | Guckel et al. | |
| 5,240,550 A | 8/1993 | Boehnke et al. | |
| 5,242,711 A | 9/1993 | DeNatale et al. | |
| 5,259,926 A | 11/1993 | Kuwabara et al. | |
| 5,298,556 A | 3/1994 | Stephens | |
| 5,314,731 A | 5/1994 | Yoneda et al. | |
| 5,318,870 A | 6/1994 | Hartney | |
| 5,331,020 A | 7/1994 | Brown et al. | |
| 5,362,940 A | 11/1994 | MacDonald et al. | |
| 5,368,942 A | 11/1994 | Smith et al. | |
| 5,369,722 A | 11/1994 | Heming et al. | |
| 5,371,822 A | 12/1994 | Horwitz et al. | |
| 5,374,454 A | 12/1994 | Bickford et al. | |
| 5,380,474 A | 1/1995 | Rye et al. | |
| 5,389,696 A | 2/1995 | Dempsey et al. | |
| 5,395,954 A | 3/1995 | Soria et al. | |
| 5,425,848 A | 6/1995 | Haisma et al. | |
| 5,432,700 A | 7/1995 | Hrovat et al. | |
| 5,439,766 A | 8/1995 | Day et al. | |
| 5,458,953 A | 10/1995 | Wang et al. | |
| 5,459,198 A | 10/1995 | Sharp | |
| 5,462,700 A | 10/1995 | Beeson et al. | |
| 5,480,047 A | 1/1996 | Tanigawa et al. | |
| 5,482,768 A | 1/1996 | Kawasato et al. | |
| 5,512,131 A | 4/1996 | Kumar et al. | |

(Continued)

FOREIGN PATENT DOCUMENTS

DE  10237280 A1  3/2004
EP  0592139  4/1994

(Continued)

OTHER PUBLICATIONS

Matinlinna et al. The effect of a novel silane blend system on resin bond strength to silica-coated Ti substrate. Journal of Denistry, 34, 2005 (online print date), 436-443.*
Alpha-Silanes from Wacker Improve Scratch Resistance of Coatings and Bonding Properties of Adhesives. SpecialChem—Mar. 22, 2005. [online]. Retrieved online on [Apr. 6, 2012]. Retrieved from Internert <URL://http://www.specialchem4coatings.com/news-trends/displaynews.aspx?id=2774>.*
Wacker Chemie AG. Technical Brochure for Geniosil (2011) retrieved online on 4/6/08/2012]. Retrieved from URL:<http://www.wacker.com/cms/media/publications/downloads/6085_EN.pdf>.*
Hu et al., Fluorescence Probe Techniques (FPT) for Measuring the Relative Efficiencies of Free-Radical Photoinitiators, Macromolecules 1998, 31, pp. 4107-4113 May 29, 1998.

(Continued)

*Primary Examiner* — Sanza McClendon
(74) *Attorney, Agent, or Firm* — Heather L. Flanagan; Fish & Richardson P.C.

(57) ABSTRACT

The invention provides a method of applying an adhesion primer layer for an imprint lithography process that includes contacting a fluid with a surface of a substrate in a coating process and initiating a chemical reaction that forms a covalent bond between a component in the fluid and the surface of the substrate such that an adhesion primer layer is adhered to the surface of the substrate. A polymeric layer may be adhered to the surface of the substrate coated with the adhesion primer layer. The method allows adhesion primer coating for double-sided imprinting applications including patterned magnetic media.

20 Claims, 4 Drawing Sheets

(56) References Cited

U.S. PATENT DOCUMENTS

| | | |
|---|---|---|
| 5,527,662 A | 6/1996 | Hashimoto et al. |
| 5,542,978 A | 8/1996 | Kindt-Larsen et al. |
| 5,545,367 A * | 8/1996 | Bae et al. .................. 264/401 |
| 5,550,196 A | 8/1996 | Spence et al. |
| 5,578,683 A | 11/1996 | Koch et al. |
| 5,594,042 A | 1/1997 | Glover et al. |
| 5,601,641 A | 2/1997 | Stephens |
| 5,629,095 A | 5/1997 | Bujanowski et al. |
| 5,629,128 A | 5/1997 | Shirakawa et al. |
| 5,669,303 A | 9/1997 | Maracas et al. |
| 5,723,242 A | 3/1998 | Woo et al. |
| 5,725,788 A | 3/1998 | Maracas et al. |
| 5,731,092 A | 3/1998 | Breant et al. |
| 5,772,905 A | 6/1998 | Chou |
| 5,776,748 A | 7/1998 | Singhvi et al. |
| 5,812,629 A | 9/1998 | Clauser |
| 5,820,769 A | 10/1998 | Chou |
| 5,837,314 A | 11/1998 | Beaton et al. |
| 5,849,209 A | 12/1998 | Kindt-Larsen et al. |
| 5,849,222 A | 12/1998 | Jen et al. |
| 5,858,580 A | 1/1999 | Wang et al. |
| 5,861,467 A | 1/1999 | Bujanowski et al. |
| 5,888,650 A | 3/1999 | Calhoun et al. |
| 5,895,263 A | 4/1999 | Carter et al. |
| 5,942,302 A | 8/1999 | Ha et al. |
| 5,948,470 A | 9/1999 | Harrison et al. |
| 5,956,216 A | 9/1999 | Chou |
| 5,974,150 A | 10/1999 | Kaish et al. |
| 6,015,609 A | 1/2000 | Chaouk et al. |
| 6,046,056 A | 4/2000 | Parce et al. |
| 6,060,530 A | 5/2000 | Chaouk et al. |
| 6,063,888 A | 5/2000 | Yamaguchi et al. |
| 6,074,827 A | 6/2000 | Nelson et al. |
| 6,117,708 A | 9/2000 | Wensel |
| 6,132,632 A | 10/2000 | Haney et al. |
| 6,146,811 A | 11/2000 | Kim et al. |
| 6,160,030 A | 12/2000 | Chaouk et al. |
| 6,174,931 B1 | 1/2001 | Moon et al. |
| 6,174,932 B1 | 1/2001 | Pachl et al. |
| 6,190,929 B1 | 2/2001 | Wang et al. |
| 6,200,736 B1 | 3/2001 | Tan |
| 6,204,343 B1 | 3/2001 | Barucha et al. |
| 6,218,316 B1 | 4/2001 | Marsh |
| 6,225,367 B1 | 5/2001 | Chaouk et al. |
| 6,261,469 B1 | 7/2001 | Zakhidov et al. |
| 6,274,294 B1 | 8/2001 | Hines |
| 6,309,580 B1 | 10/2001 | Chou |
| 6,316,290 B1 | 11/2001 | Wensel |
| 6,326,627 B1 | 12/2001 | Putvinski et al. |
| 6,334,960 B1 | 1/2002 | Willson et al. |
| 6,344,105 B1 | 2/2002 | Daugherty et al. |
| 6,348,999 B1 | 2/2002 | Summersgill et al. |
| 6,355,198 B1 | 3/2002 | Kim et al. |
| 6,391,217 B2 | 5/2002 | Schaffer et al. |
| 6,399,406 B2 | 6/2002 | Chan et al. |
| 6,446,933 B1 | 9/2002 | Westmoreland |
| 6,447,919 B1 | 9/2002 | Brown et al. |
| 6,468,642 B1 | 10/2002 | Bray et al. |
| 6,475,704 B1 | 11/2002 | Iwasaki et al. |
| 6,482,742 B1 | 11/2002 | Chou |
| 6,495,624 B1 | 12/2002 | Brown |
| 6,497,961 B2 | 12/2002 | Kang et al. |
| 6,498,640 B1 | 12/2002 | Ziger |
| 6,503,914 B1 | 1/2003 | Benish et al. |
| 6,517,977 B2 | 2/2003 | Resnick et al. |
| 6,517,995 B1 | 2/2003 | Jacobson et al. |
| 6,518,168 B1 | 2/2003 | Clem et al. |
| 6,518,189 B1 | 2/2003 | Chou |
| 6,541,356 B2 | 4/2003 | Fogel et al. |
| 6,544,594 B2 | 4/2003 | Linford et al. |
| 6,565,776 B1 | 5/2003 | Li et al. |
| 6,580,172 B2 | 6/2003 | Mancini et al. |
| 6,605,849 B1 | 8/2003 | Lutwak et al. |
| 6,607,173 B2 | 8/2003 | Westmoreland |
| 6,610,458 B2 | 8/2003 | Miller et al. |
| 6,621,960 B2 | 9/2003 | Wang et al. |
| 6,646,662 B1 | 11/2003 | Nebashi et al. |
| 6,649,272 B2 | 11/2003 | Moore et al. |
| 6,664,026 B2 | 12/2003 | Nguyen et al. |
| 6,664,306 B2 | 12/2003 | Gaddam et al. |
| 6,667,082 B2 | 12/2003 | Bamore et al. |
| 6,678,038 B2 | 1/2004 | Binnard |
| 6,696,220 B2 | 2/2004 | Bailey et al. |
| 6,713,238 B1 | 3/2004 | Chou et al. |
| 6,719,915 B2 | 4/2004 | Willson et al. |
| 6,720,076 B2 | 4/2004 | McBain |
| 6,721,529 B2 | 4/2004 | Chen et al. |
| 6,737,489 B2 | 5/2004 | Linert et al. |
| 6,774,183 B1 | 8/2004 | Palumbo et al. |
| 6,776,094 B1 | 8/2004 | Whitesides et al. |
| 6,790,905 B2 | 9/2004 | Fitzgerald et al. |
| 6,802,870 B2 | 10/2004 | Chang et al. |
| 6,809,356 B2 | 10/2004 | Chou |
| 6,828,244 B2 | 12/2004 | Chou |
| 6,830,819 B2 | 12/2004 | Kaplan et al. |
| 6,849,558 B2 | 2/2005 | Schaper |
| 6,873,087 B1 | 3/2005 | Choi et al. |
| 6,900,881 B2 | 5/2005 | Sreenivasan et al. |
| 6,908,861 B2 | 6/2005 | Sreenivasan et al. |
| 6,916,584 B2 | 7/2005 | Sreenivasan et al. |
| 6,916,585 B2 | 7/2005 | Sreenivasan et al. |
| 6,932,934 B2 | 8/2005 | Choi et al. |
| 6,936,194 B2 | 8/2005 | Watts et al. |
| 6,946,360 B2 | 9/2005 | Chou |
| 6,955,767 B2 | 10/2005 | Chen |
| 6,957,608 B1 | 10/2005 | Hubert |
| 6,958,531 B2 | 10/2005 | Ucok et al. |
| 6,964,793 B2 | 11/2005 | Willson et al. |
| 7,011,932 B2 | 3/2006 | Ferm et al. |
| 7,037,639 B2 | 5/2006 | Voisin |
| 7,077,992 B2 | 7/2006 | Sreenivasan et al. |
| 7,117,583 B2 | 10/2006 | Dinan et al. |
| 7,122,482 B2 | 10/2006 | Xu et al. |
| 7,128,875 B2 | 10/2006 | Cubicciotti |
| 7,138,362 B2 | 11/2006 | Abe et al. |
| 7,141,188 B2 | 11/2006 | Li et al. |
| 7,157,036 B2 | 1/2007 | Choi et al. |
| 7,163,888 B2 | 1/2007 | Gehoski et al. |
| 7,241,823 B2 | 7/2007 | Kashiwagi et al. |
| 7,309,225 B2 | 12/2007 | McMackin et al. |
| 7,338,275 B2 | 3/2008 | Choi et al. |
| 7,365,103 B2 | 4/2008 | Willson et al. |
| 7,393,789 B2 | 7/2008 | Abatchev et al. |
| 7,396,475 B2 | 7/2008 | Sreenivasan |
| 7,727,453 B2 | 6/2010 | Sreenivasan et al. |
| 7,837,921 B2 | 11/2010 | Xu et al. |
| 2001/0044075 A1 | 11/2001 | Nishimura et al. |
| 2002/0042027 A1 | 4/2002 | Chou et al. |
| 2002/0072009 A1 | 6/2002 | Kim et al. |
| 2002/0094496 A1 | 7/2002 | Choi et al. |
| 2002/0123592 A1 | 9/2002 | Zhang |
| 2002/0132482 A1 | 9/2002 | Chou |
| 2002/0135099 A1 | 9/2002 | Robinson et al. |
| 2002/0146642 A1 | 10/2002 | Kim et al. |
| 2002/0167117 A1 | 11/2002 | Chou |
| 2002/0168578 A1 | 11/2002 | Wang et al. |
| 2002/0170880 A1 | 11/2002 | Chen |
| 2003/0017368 A1 | 1/2003 | Wu et al. |
| 2003/0025895 A1 | 2/2003 | Binnard |
| 2003/0034329 A1 | 2/2003 | Chou |
| 2003/0054115 A1 | 3/2003 | Albano et al. |
| 2003/0062334 A1 | 4/2003 | Lee et al. |
| 2003/0080471 A1 | 5/2003 | Chou |
| 2003/0080472 A1 | 5/2003 | Chou |
| 2003/0081193 A1 | 5/2003 | White et al. |
| 2003/0137494 A1 | 7/2003 | Tulbert |
| 2003/0166814 A1 | 9/2003 | Sparrowe et al. |
| 2003/0174435 A1 | 9/2003 | Dinan et al. |
| 2003/0186140 A1 | 10/2003 | Fries |
| 2003/0235787 A1 | 12/2003 | Watts et al. |
| 2004/0036201 A1 | 2/2004 | Chou et al. |
| 2004/0037956 A1 | 2/2004 | Yang |
| 2004/0046288 A1 | 3/2004 | Chou |
| 2004/0065252 A1 | 4/2004 | Sreenivasan et al. |

(56) References Cited

U.S. PATENT DOCUMENTS

| | | |
|---|---|---|
| 2004/0065976 A1 | 4/2004 | Sreenivasan et al. |
| 2004/0110096 A1 | 6/2004 | Kishioka et al. |
| 2004/0110856 A1 | 6/2004 | Young et al. |
| 2004/0116548 A1 | 6/2004 | Willson et al. |
| 2004/0118809 A1 | 6/2004 | Chou et al. |
| 2004/0127613 A1 | 7/2004 | Kashiwagi et al. |
| 2004/0131718 A1 | 7/2004 | Chou et al. |
| 2004/0137734 A1 | 7/2004 | Chou et al. |
| 2004/0156108 A1 | 8/2004 | Chou et al. |
| 2004/0157078 A1 | 8/2004 | Yoshida |
| 2004/0168613 A1 | 9/2004 | Nguyen et al. |
| 2004/0170770 A1 | 9/2004 | Nguyen et al. |
| 2004/0175631 A1 | 9/2004 | Crocker et al. |
| 2004/0188381 A1 | 9/2004 | Sreenivasan |
| 2004/0191429 A1 | 9/2004 | Patrick |
| 2004/0192041 A1 | 9/2004 | Jeong et al. |
| 2004/0197843 A1 | 10/2004 | Chou et al. |
| 2004/0202865 A1 | 10/2004 | Homola et al. |
| 2004/0241338 A1 | 12/2004 | Foster et al. |
| 2004/0250945 A1 | 12/2004 | Zheng et al. |
| 2004/0259992 A1 | 12/2004 | Gobel |
| 2005/0037143 A1 | 2/2005 | Chou et al. |
| 2005/0084804 A1 | 4/2005 | Truskett et al. |
| 2005/0098534 A1 | 5/2005 | Sreenivasan et al. |
| 2005/0118749 A1 | 6/2005 | Sakamoto et al. |
| 2005/0156357 A1 | 7/2005 | Willson et al. |
| 2005/0160934 A1 | 7/2005 | Xu et al. |
| 2005/0187339 A1 | 8/2005 | Xu et al. |
| 2005/0224452 A1 | 10/2005 | Spiess et al. |
| 2005/0236739 A1 | 10/2005 | Willson et al. |
| 2006/0029811 A1 | 2/2006 | Sugioka et al. |
| 2006/0030071 A1 | 2/2006 | Mizukoshi et al. |
| 2006/0030653 A1 | 2/2006 | Hu et al. |
| 2006/0035029 A1 | 2/2006 | Xu et al. |
| 2006/0040058 A1* | 2/2006 | Heidari et al. ............ 427/256 |
| 2006/0046069 A1 | 3/2006 | Jung |
| 2006/0062867 A1 | 3/2006 | Choi et al. |
| 2006/0062922 A1 | 3/2006 | Xu et al. |
| 2006/0076717 A1 | 4/2006 | Sreenivasan et al. |
| 2006/0077374 A1 | 4/2006 | Sreenivasan et al. |
| 2006/0081557 A1 | 4/2006 | Xu et al. |
| 2006/0108710 A1 | 5/2006 | Xu et al. |
| 2006/0111454 A1 | 5/2006 | Xu et al. |
| 2006/0145398 A1 | 7/2006 | Bailey et al. |
| 2006/0175736 A1 | 8/2006 | Xu et al. |
| 2006/0188751 A1 | 8/2006 | Okawa et al. |
| 2006/0222897 A1 | 10/2006 | Kamata et al. |
| 2006/0279024 A1 | 12/2006 | Choi et al. |
| 2007/0017631 A1 | 1/2007 | Xu |
| 2007/0021520 A1* | 1/2007 | Xu ............................. 522/1 |
| 2007/0042173 A1 | 2/2007 | Nagaoka et al. |
| 2007/0051697 A1 | 3/2007 | DiPietro et al. |
| 2007/0059211 A1 | 3/2007 | Edmiston |
| 2007/0141271 A1 | 6/2007 | Xu et al. |
| 2007/0212494 A1 | 9/2007 | Xu et al. |
| 2007/0272825 A1 | 11/2007 | Xu et al. |
| 2008/0110557 A1 | 5/2008 | Xu |
| 2008/0131623 A1 | 6/2008 | Zhang et al. |
| 2008/0138460 A1 | 6/2008 | Heidari et al. |
| 2009/0136654 A1 | 5/2009 | Xu et al. |
| 2009/0155583 A1 | 6/2009 | Xu et al. |
| 2009/0197057 A1 | 8/2009 | Xu et al. |
| 2010/0112236 A1 | 5/2010 | Fletcher et al. |

FOREIGN PATENT DOCUMENTS

| | | |
|---|---|---|
| EP | 0592972 | 4/1994 |
| EP | 592972 A2 * | 4/1994 |
| EP | 786464 A1 | 7/1997 |
| EP | 1342736 A2 | 9/2003 |
| EP | 1491356 A2 | 12/2004 |
| EP | 1533657 | 5/2005 |
| JP | 61-40845 | 2/1986 |
| JP | 1-196749 | 8/1989 |
| JP | 02-24848 | 1/1990 |
| JP | 02-92603 | 4/1990 |
| JP | 02192045 | 7/1990 |
| JP | 2-248480 | 10/1990 |
| JP | 3-90345 | 4/1991 |
| JP | 4330650 | 11/1992 |
| JP | 8208781 A | 8/1996 |
| JP | 9502406 A | 3/1997 |
| JP | 9-278490 | 10/1997 |
| JP | 2002060529 | 2/2002 |
| JP | 2002-285071 | 10/2002 |
| JP | 2002355543 A | 12/2002 |
| JP | 2004051706 | 2/2004 |
| KR | 10-0153746 | 11/1998 |
| WO | WO 87/02935 | 5/1987 |
| WO | WO 91/04151 | 4/1991 |
| WO | WO9600656 A1 | 1/1996 |
| WO | WO 99/05724 | 2/1999 |
| WO | WO 00/21689 | 4/2000 |
| WO | WO 00/46035 | 8/2000 |
| WO | WO 01/47003 | 6/2001 |
| WO | WO 01/53889 | 7/2001 |
| WO | WO0163605 A1 | 8/2001 |
| WO | WO 02/069040 A1 | 9/2002 |
| WO | WO 03/073164 A2 | 9/2003 |
| WO | WO/2004/021083 | 3/2004 |
| WO | WO03087935 A2 | 4/2004 |
| WO | WO2004097518 | 11/2004 |
| WO | WO/2007/050133 | 5/2007 |
| WO | WO2008127835 A1 | 10/2008 |
| WO | WO/2009/085090 | 7/2009 |
| WO | WO2010051024 A1 | 5/2010 |

OTHER PUBLICATIONS

Blomquist et al., Fluorinated Acrylates in making Low-Loss, Low-Birefringence, and Single-Mode Optical Waveguides with Exceptional Thermo-Optic Properties, SPIE Conference on Linear Optical Properties of Waveguides and Fibers, vol. 3799, pp. 266-279 Jul. 1, 1999.

Bender et al., Multiple Imprinting in UV-based Nanoimprint Lithography: Related Material Issues, Microelectronic Engineering 61-62, pp. 407-413 Jan. 1, 2002.

Hirai et al., Abstract of Mold Surface Treatment for Imprint Lithography, Journal of Photopolymer Science and Technology, pp. 457-462, vol. 14, No. 3 Aug. 1, 2001.

Hirai et al., Mold Surface Treatment for Imprint Lithography, Journal of Photopolymer Science and Technology, vol. 14, No. 3, pp. 457-462 Aug. 1, 2001.

Roos et al., Nanoimprint Lithography with a Commercial 4 Inch Bond System for Hot embossing, Proceedings of SPIE vol. 4343, pp. 427-435 Oct. 1, 2001.

Roos et al., Abstract of Nanoimprint Lithography with a Commercial 4 Inch Bond System for Hot Embossing, Proceedings of SPIE vol. 4343, pp. 427-435 Oct. 1, 2001.

Sung et al., Abstract of Micro/nano-tribological Characteristics of Self-Assembled Monolayer and its Application in Nano-Structure Fabrication, Elsevier Science B.V., vol. 255, No. 7 Jul. 1, 2003.

Sung et al., Micro/nano-tribological Characteristics of Self-Assembled Monolayer and its Application in Nano-Structure Fabrication, Elsevier Science B.V., vol. 255, No. 7, pp. 808-818 Jul. 1, 2003.

Papirer et al., Abstract of The Grafting of Perfluorinated Silanes onto the Surface of Silica: Characterization by Inverse Gas Chromatography, Journal of Colloid and Interface Science 159, pp. 238-242 Aug. 1, 1993.

Papirer et al., The Grafting of Perfluorinated Silanes onto the Surface of Silica: Characterization by Inverse Gas Chromatography, Journal of Colloid and Interface Science 159, pp. 238-242 Aug. 1, 1993.

Chou et al., Nanoimprint Lithography, Journal of Vacuum Science Technolgoy B 14(16), pp. 4129-4133 Nov. 1, 1996.

Hakovirta et al., Optical Properties of Fluorinated Diamond-Like Carbon Films Produced by Pulsed Glow Discharge Plasma Immersion Ion Processing, Journal of Applied Physics 88(3); pp. 1456-1459 Aug. 1, 2000.

Yu et al., Properties of Fluorinated Amorphous Diamond Like Carbon Films by PECVD, Applied Surface Science 219 (3-4); pp. 228-237 Dec. 1, 2003.

(56) References Cited

OTHER PUBLICATIONS

Compon et al., Electroanalysis at Diamond-Like and Doped-Diamond Electrodes, Electroanalysis 15(17); pp. 1349-1363 Sep. 1, 2003.

Mansano et al., Protective Carbon Layer for Chemical Corrosion of Stainless Steel, Diamond and Related Materials 12 (3-7); pp. 749-752 Mar. 1, 2003.

Butter et al., Production and Wetting Properties of Fluorinated Diamond-Like Carbon Coatings, Thin Solid Films, 311(1-2); pp. 107-113 Dec. 31, 1997.

Hakovirta et al., Heat Resistance of Fluorinated Diamond-Like Carbon Films, Diamond and Related Materiasl 10(8); pp. 1486-1490 Aug. 1, 2001.

Zhu et al., The Improvement of the Oxidation Resistance of TiAl Alloys by Fluorine Plasma-Based Ion Implantation, Surface and Coatings Technology 158; pp. 502-507 Sep. 1, 2002.

Yao et al., Structural, Mechanical and Hydrophobic Properties of Fluorine-Doped Diamond-Like Carbon Films Synthesized by Plasma Immersion Ion Implantation and Deposition (PIII-D), Applied Surface Science 230; pp. 172-178 Apr. 17, 2004.

Bailey et al., Step and Flash Imprint Lithography: Template Surface Treatment and Defect Analysis, Journal of Vacuum Science, B 18(6), pp. 3572-3577 Nov. 1, 2000.

Novec Fluorosurfactant FC-4432, http://multimedia.mmm.com/mws/mediawebserver.dyn?333333SQa783cMj3wMj333wyXuFiiiiH—Aug. 4, 2005.

Abstract of Japanese Patent 61-040845, Feb. 27, 1986.

Abstract of Japanese Patent 02-248480, Oct. 4, 1990.

Abstract of Japanese Patent 3-090345, Apr. 16, 1991.

Abstract of Japanese Patent 09-278490, Oct. 28, 1997.

Resnick et al., Release Layers for Contact and Imprint Lithography, Semiconductor International, pp. 71-80 Jun. 1, 2002.

Novec Fluorosurfacants for Paints and Coatings, Nov. 3, 2003.

Translation of Japanese Patent 61-40845, Feb. 1, 1986.

Translation of Japanese Patent 02-248480, Oct. 1, 1990.

Translation of Japanese Patent 03-090345, Apr. 1, 1991.

Translation of Japanese Patent 09-278490, Oct. 1, 1997.

Abstract of Japanese Patent 03-090345, Apr. 1, 1991.

Abstract of Japanese Patent 09-278490, Oct. 1, 1997.

Colburn et al., Dissertation for the Degree of Doctor of Philosophy, Step and Flash Imprint Lithography: A Low-Pressure, Room-Temperature Nanoimprint Lithography Aug. 1, 2001.

FC-4432 Produce Brochure, 3M Fluorosurfactant Mar. 1, 2002.

U.S. Appl. No. 11/560,266, naming Inventors Xu, entitled Methods and Compositions for Providing Preferential Adhesion and Release of Adjacent Surfaces, filed Nov. 15, 2006.

U.S. Appl. No. 11/837,757, naming Inventors Xu et al., entitled Composition to Reduce Adhesion between a Conformable Region and a Mol, filed Aug. 13, 2007.

PCT/US2008/057518 ISR, Jun. 25, 2008.

Johnson et al., Advances in Step and Flash Imprint Lithography, SPIE Microlithography Conference Feb. 23, 2003.

Chou et al., Lithographically Induced Self-assembly of Periodic Polymer Micropillar Arrays, J. Vac. Sci. Technol. B 17 (6), pp. 3197-3202 Nov. 1, 1999.

Colburn et al., Step and Flash Imprint Lithography: A New Approach to High-Resolution Patterning, Proc. of SPIE, vol. 3676 Mar. 1, 1999.

Chou, Nanoimprint Lithography and Lithographically Induced Self-Assembly, MRS Bulletin, pp. 512-517 Jul. 1, 2001.

Choi et al., Design of Orientation Stages for Step and Flash Imprint Lithography, Precision Engineering, pp. 192-199 Jan. 1, 2001.

Xia et al., Soft Lithography, Angew. Chem. Int. Ed., pp. 550-575 Jan. 1, 1998.

Chou et al., Imprint Lithography with Sub-10 nm Feature Size and High Throughput, Microelectronic Engineering 35, pp. 237-240 Jan. 1, 1997.

Haisma et al., Mold-assisted Nanolithography: A Process for Reliable Pattern Replication, J. Vac. Sci. Technol. 8, pp. 4124-4128 Nov. 1, 1996.

Chou et al., Imprint of Sub-25 nm Vias and Trenches in Polymers, Appl. Phys. Lett. 67 (21) Nov. 20, 1995.

Bender et al., Fabrication of Nanostructures using a UV-based Imprint Technique, Microelectronic Engineering 53, pp. 233-236 Jan. 1, 2000.

Nguyen, Asymmetric Fluid-Structure Dynamics in Nanoscale Imprint Lithography, The University of Texas at Austin, pp. 1-111 Aug. 1, 2001.

Colburn et al., Step and Flash Imprint Lithography for sub-100 nm Patterning, Proceedings of SPIE vol. 3997, pp. 453-457 Jan. 1, 2000.

Chou et al., Imprint Lithography with 25-Nanometer Resolution, Science vol. 272, pp. 85-87 Apr. 5, 1996.

Heidari, Nanoimprint Lithography at the 6 in. Wafer Scale, J. Vac. Sci. Technol. B 18(6), pp. 3557-3560 Nov. 1, 2000.

Abstract of Japanese Patent 02-92603, Aug. 12, 2004.

Translation of Japanese Patent 02-92603, Apr. 3, 1990.

Translation of Japanese Patent 02-24848, Jan. 26, 1990.

Abstract of Japanese Patent 02-24848, Jan. 26, 1990.

Chou et al., Ultrafast and Direct Imprint of Nanostructures in Silicon, Nature, Col. 417, (Jun. 2002), pp. 835-837 Jun. 1, 2002.

Colburn et al., Development and Advantages of Step-and-Flash Lithography, Solid State Technology Jul. 1, 2001.

Colburn et al., Characterization and Modeling of Volumetric and Mechanical Properties for Step and Flash Imprint Lithography Photopolymers, Journal of Vacuum Science Technology. vol. b. 19(6) Nov. 1, 2001.

Bailey et al., Step and Flash Imprint Lithography: Defect Analysis, Journal of Vacuum Science, B 19(6), pp. 2806-2810 Nov. 1, 2001.

Schneider et al., Stripes of Partially Fluorinated Alkyl Chains: Dipolar Langmuir Monolayers, J. Chem. Phys. vol. 122, Issue 9 Mar. 1, 2005.

Golden et al., Designing Porous Low-k Dielectrics, www.reed-electronics.com/semiconductor/index.asp?layout=articlePrint&articleID=CA82824 Apr. 6, 2005.

Padovani et al., Chemically Bonded Porogens in Methylsilsesquioxane: I. Structure and Bonding, Journal of the Electrochemical Society, 149 (12) F161-F170 Oct. 16, 2002.

Wolf et al., Silicon Processing for the VLSI Era, vol. 1—Process Technology, pp. 407-413 Jan. 1, 1986.

Taniguchi et al., Diamond Nanoimprint Lithography, Nanotechnology, 2002, vol. 13, No. 5, pp. 592-596(5) Jan. 1, 2002.

Kiyohara et al., Abstract of Plasma Etching of CVD Diamond Films using an ECR-type Oxygen Source, http://www.iop.org/EJ/abstract/0957-4484/10/4/304 Sep. 26, 2003.

Wolf et al., Silicon Processing for the VLSI Era, vol. 1—Process Technology, pp. 541, 542, 544, 564, 565 Jan. 1, 1986.

Huang et al., Reversal Imprinting by Transferring Polymer from Mold to Substrate, J. Vac. Sc. Technol. B 20(6); pp. 2872-2876 Nov. 1, 2002.

DuPont Zonyl Fluorochemical Intermediates, www.dupont.com/zonyl/pdf/intermediates.pdf; pp. 1-16 Jun. 21, 2003.

DuPont Zonyl UR, www.dupont.com/zonyl/pdf/UR.pdf; pp. 1-2 Jun. 21, 2003.

DuPont Zonyl FSN, www.dupont.com/zonyl/odf/FSN.pdf; pp. 1-2 Aug. 24, 2003.

Masurf FS-230, www.masonsurfactants.com/Products/Masurf_FS_230.htm; pp. 1-2 Apr. 5, 2004.

Morita et al., Three-Dimensional Nanoimprint Fabrication by Focused-Ion-Beam Chemical Vapor Deposition, Jpn. J. Appl. Phys., vol. 42, Pt. 1, No. 6B, pp. 3874-3876 Jan. 1, 2003.

Dorfman et al., Diamond-like nanocomposites (DLN), Thin Solid Films, vol. 212; pp. 267-273 May 15, 1992.

Abstract of Japanese patent 02-192045, Jul. 27, 1990.

Bender, M.; "Multiple imprinting UV-based nanoimprint lithography: related material issues;" Microelectronic Engineering; 2002; pp. 407-413; Elsevier Science B.V.

International Search Report for Publication No. WO/2009/085090, dated Jun. 1, 2009, 1 page.

International Search Report for Publication No. for WO/2007/050133, dated Sep. 13, 2007, 1 page.

Peeters et al., '07O-NMR of Sol-Gel Processes of TEOS and TMOS,' Journal of Sol-Gel Science and Technology 13 (1998) 71-74.

(56) References Cited

OTHER PUBLICATIONS

Taniguchi et al., 'Measurement of Adhesive Force Between Mold and Photocurable Resin in Imprint Technology,' Japanese Journal of Applied Physics, 41 (2002) 4194-4197.
Supplementary European Search Report, Application No. EP 08744071; Dec. 22, 2010.

PCT/US2010/058089 International Search Report and Written Opinion, PCT, Aug. 29, 2011, 12 pages.
Schenectady International, Inc Technical Data Sheet for IsoRad™ 501. [online], [retrieved on Oct. 18, 2011]. Retrieved from the Internet: URL: www.siigroup.com/product_documents/IsoRad501. PDF; 1 page.

* cited by examiner

METHOD FOR IMPRINT LITHOGRAPHY UTILIZING AN ADHESION PRIMER LAYER

RELATED PATENTS/APPLICATIONS

The present application is continuation-in-part of U.S. patent application Ser. No. 11/187,407 entitled "Method For Adhering Materials Together," listing Frank Y. Xu as the inventor, filed on Jul. 22, 2005, now U.S. Patent Publication No. 20070017631, which is incorporated by reference herein. This application is also continuation-in-part of U.S. patent application Ser. No. 11/187,406 entitled "Composition For Adhering Materials Together," listing Frank Y. Xu as the inventor, filed on Jul. 22, 2005, now U.S. Patent Publication No. 20070021520, which is incorporated by reference herein.

TECHNICAL FIELD

The invention provides a method of applying an adhesion primer layer for an imprint lithography process. The method allows adhesion primer coating for double-sided imprinting applications including patterned magnetic media.

BACKGROUND

Nano-fabrication involves the fabrication of very small structures, e.g., having features on the order of nanometers or smaller. One area in which nano-fabrication has had a sizeable impact is in the processing of integrated circuits. As the semiconductor processing industry continues to strive for larger production yields while increasing the circuits per unit area formed on a substrate, nano-fabrication becomes increasingly important. Nano-fabrication provides greater process control while allowing increased reduction of the minimum feature dimension of the structures formed. Other areas of development in which nano-fabrication has been employed include biotechnology, optical technology, mechanical systems and the like.

An exemplary nano-fabrication technique is commonly referred to as imprint lithography. Exemplary imprint lithography processes are described in detail in numerous publications, such as U.S. Patent Application Publication No. 20040065976 to Sreenivasan et al., entitled "Method and a Mold to Arrange Features on a Substrate to Replicate Features having Minimal Dimensional Variability;" U.S. Patent Application Publication No. 20040065252 to Sreenivasan et al., entitled "Method of Forming a Layer on a Substrate to Facilitate Fabrication of Metrology Standards;" and U.S. Pat. No. 6,936,194 to Watts, entitled "Functional Patterning Material for Imprint Lithography Processes;" all of which are incorporated by reference herein.

The fundamental imprint lithography technique disclosed in each of the aforementioned United States patent application publications and United States patent includes formation of a relief pattern in a polymerizable layer and transferring a pattern corresponding to the relief pattern into an underlying substrate. The substrate may be positioned upon a motion stage to obtain a desired position to facilitate patterning thereof. A template is employed spaced-apart from the substrate with a formable liquid present between the template and the substrate. The liquid is solidified to form a solidified layer that has a pattern recorded therein that is conforming to a shape of the surface of the template in contact with the liquid. The template is then separated from the solidified layer such that the template and the substrate are spaced-apart. The substrate and the solidified layer are then subjected to processes to transfer, into the substrate, a relief image that corresponds to the pattern in the solidified layer.

Figure 1:
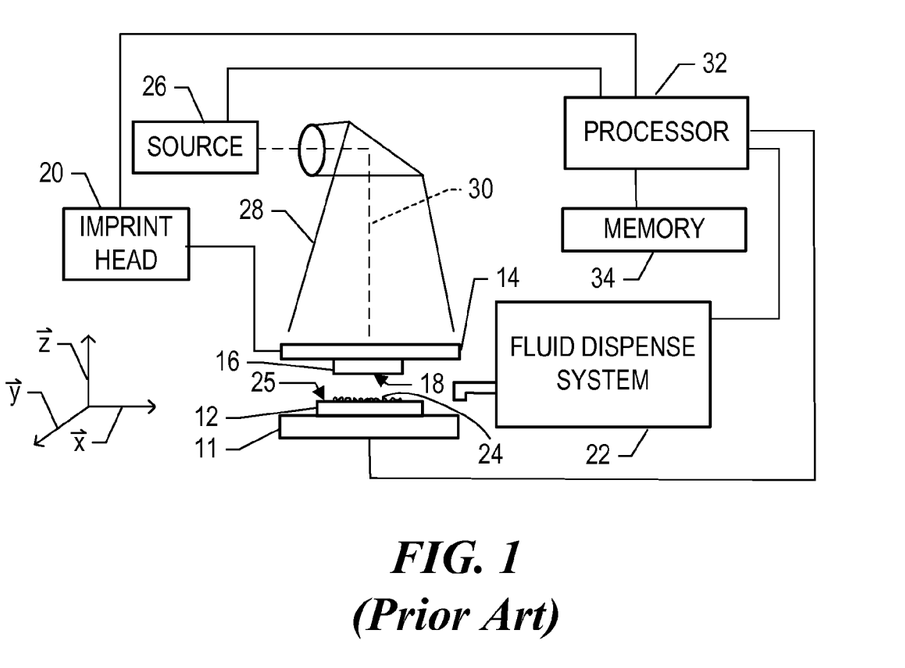
FIG. 1 is a simplified plan view of a lithographic system in accordance with the prior art.

Referring to FIG. 1, the basic concept behind imprint lithography is forming a relief pattern on a substrate that may function as, inter alia, an etching mask so that a pattern may be formed into the substrate that corresponds to the relief pattern. A system 10 employed to form the relief pattern includes a stage 11 upon which a substrate 12 is supported, and a template 14 having a mold 16 with a patterning surface 18 thereon. Patterning surface 18 may be substantially smooth and/or planar, or may be patterned so that one or more recesses are formed therein. Template 14 is coupled to an imprint head 20 to facilitate movement of template 14. A fluid dispense system 22 is coupled to be selectively placed in fluid communication with substrate 12 so as to deposit polymerizable material 24 thereon. A source 26 of energy 28 is coupled to direct energy 28 along a path 30. Imprint head 20 and stage 11 are configured to arrange mold 16 and substrate 12, respectively, to be in superimposition, and disposed in path 30. Either imprint head 20, stage 11, or both vary a distance between mold 16 and substrate 12 to define a desired volume therebetween that is filled by polymerizable material 24.

Typically, polymerizable material 24 is disposed upon substrate 12 before the desired volume is defined between mold 16 and substrate 12. However, polymerizable material 24 may fill the volume after the desired volume has been obtained. After the desired volume is filled with polymerizable material 24, source 26 produces energy 28, which causes polymerizable material 24 to solidify and/or cross-link, forming polymeric material conforming to the shape of the substrate surface 25 and mold surface 18. Control of this process is regulated by processor 32 that is in data communication with stage 11 imprint head 20, fluid dispense system 22, and source 26, operating on a computer-readable program stored in memory 34.

One criterion associated with accurately transforming a pattern into a polymerizable material is to reduce, if not prevent, adhesion to the template of the solidified layer, while ensuring suitable adhesion to the substrate. This is referred to as preferential release and adhesion properties. By preferential release and adhesion, the pattern recorded in the solidified layer is not distorted during separation of the template.

A method to improve the adhesion of the solidified layer to the substrate is to introduce an adhesion primer layer (or primer layer). The adhesion primer layer needs to adhere well to both the solidified layer and the substrate. Currently, the adhesion primer layer is put down by a spin coating method. After one side is coated, the wafer is flipped and the coated side physically touches part of spin coating apparatus in order to coat the second side. The physical contact between the spin coating apparatus and the coated surface can result in particle contamination of the adhesion primer layer. In addition, utilizing the spin coating process to apply the adhesion primer layer may limit the overall throughput of the process.

SUMMARY

This invention relates to a method for an imprint lithography process utilizing an adhesion primer layer. In general, in one aspect, the invention features a method including the steps of: (a) contacting a fluid with a surface of a substrate in a coating process, wherein a component of the fluid has a first functional group on a first end of the component and a second functional group on a second end of the component; (b) initiating a first chemical reaction that forms a first covalent bond between the first end of the component and the surface of the substrate such that an adhesion primer layer is adhered to the surface of the substrate; and (c) adhering a polymeric layer to the surface of the substrate with an imprint lithography process. The adhering includes: (i) depositing a polymerizable material on the adhesion primer layer on the surface of the substrate, (ii) initiating polymerization of the polymerizable material to form a polymeric layer, and (iii) initiating a second chemical reaction between the second functional group of the component in the adhesion primer layer and the polymerizable material to adhere the polymeric layer to the surface of the substrate.

Implementations of the invention can include one or more of the following features. Some embodiments include substantially simultaneously contacting the fluid with the surface of the substrate and with a second surface of the substrate in the coating process, and substantially simultaneously adhering the adhesion primer layer to the surface of the substrate and a second adhesion primer layer to the second surface of the substrate. Some embodiments may further include adhering a second polymeric layer to the second surface of the substrate with an imprint lithography process, wherein the adhering comprises: (a) depositing a second polymerizable material on the second adhesion primer layer on the second surface of the substrate, (b) initiating polymerization of the second polymerizable material to form a second polymeric layer, and (c) initiating the second chemical reaction between the second functional group of the component in the second adhesion primer layer and the second polymerizable material to adhere the second polymeric layer to the second surface of the substrate. The surface of the substrate and the second surface of the substrate may be substantially parallel.

The component may include a first functional group at the first end of the component. The first functional group may be a leaving group. In some embodiments, the fluid is a vapor, and the coating process is a chemical vapor deposition process. The vapor may be formed from a liquid. In some embodiments, the fluid is a liquid, and the coating process is a dip-coating process. The fluid may include an additional component, and the method may include copolymerizing the component with the additional component. In some embodiments, initiating the first chemical reaction includes heating. Initiating the second chemical reaction may include exposing the polymerizable material to UV radiation.

In some embodiments, the substrate includes silicon. The substrate may be chosen from a group consisting of silicon, silicon oxide silicon nitride, tantalum, aluminum, quartz, and fused silica. The substrate may include magnetic media.

In another aspect, the invention features a method including contacting a substrate with a multi-functional component, covalently bonding the tetravalent atom of the first end of the multi-functional component to the substrate to form an adhesion primer layer; and covalently bonding the second end of the multi-functional component to a polymerizable material during an imprint lithography process. The multi-functional component includes a first end, a second end, and a linker group between the first end and the second end. The first end includes a tetravalent atom, and the linker group is a hydrocarbon group with up to three carbon atoms.

Implementations of the invention can include one or more of the following features. The multi-functional component may have a boiling point that is at most about 350° C. and/or a viscosity that is at most about 100 cP. The linker group may be —$CH_2$—. The tetravalent atom may be silicon.

The multi-functional component may be acryloxymethyl-trimethoxysilane, Acryloxymethyltriethoxysilane, acryloxypropyltrichlorosilane, and/or acryloxypropyl-trimethoxysilane. In some embodiments, the substrate may be contacted with one or more additional components. An additional component may be 1,2-bis(trimethoxy-silyl)ethane and/or 1,6-bis(trichlorosilyl)hexane. The substrate may include silicon. In some embodiments, the substrate is chosen from a group consisting of silicon, silicon oxide silicon nitride, tantalum, aluminum, quartz, and fused silica.

In further embodiments, features from specific embodiments may be combined with features from other embodiments. For example, features from one embodiment may be combined with features from any of the other embodiments. In further embodiments, additional features may be added to the specific embodiments described herein.

DETAILED DESCRIPTION

Figure 2:
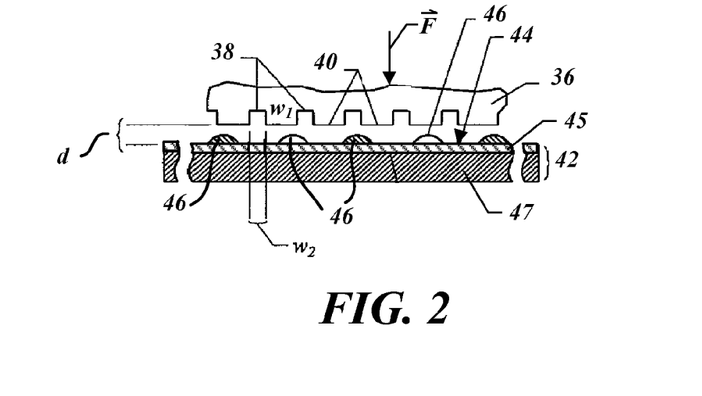
FIG. 2 is a simplified elevation view of a template and imprinting material disposed on a substrate in accordance with the present invention.

Referring to FIGS. 1 and 2, a mold 36, in accordance with the present invention, may be employed in system 10, and may define a surface having a substantially smooth or planar profile (not shown). Alternatively, mold 36 may include features defined by a plurality of spaced-apart recessions 38 and protrusions 40. The plurality of features defines an original pattern that forms the basis of a pattern to be formed on a substrate 42. Substrate 42 may comprise a bare wafer or a wafer with one or more layers disposed thereon, one of which is shown as primer layer 45. To that end, reduced is a distance "d" between mold 36 and substrate 42. In this manner, the features on mold 36 may be imprinted into a conformable region of substrate 42, such as an imprinting or polymerizable material disposed on a portion of surface 44 that presents a substantially planar profile. It should be understood that the imprinting material may be deposited using any known technique, e.g., spin-coating, dip coating and the like. In the present example, however, the imprinting material is deposited as a plurality of spaced-apart discrete droplets 46 on substrate 42. Imprinting material is formed from a composition that may be selectively polymerized and cross-linked to record the original pattern therein, defining a recorded pattern.

Specifically, the pattern recorded in the imprinting material is produced, in part, by interaction with mold 36, e.g., electrical interaction, magnetic interaction, thermal interaction, mechanical interaction or the like. In the present example, mold 36 comes into mechanical contact with the imprinting material, spreading droplets 36, so as to generate a contiguous formation 50 of the imprinting material (a polymeric layer) over surface 44. In one embodiment, distance "d" is reduced to allow sub-portions 52 of imprinting material to ingress into and fill recessions 38. To facilitate filling of recessions 38, before contact between mold 36 and droplets 46, the atmosphere between mold 36 and droplets 46 is saturated with helium or is completely evacuated or is a partially evacuated atmosphere of helium.

The imprinting material is provided with the requisite properties to completely fill recessions 38 while covering surface 44 with a contiguous formation of the imprinting material. In the present embodiment, sub-portions 54 of imprinting material in superimposition with protrusions 40 remain after the desired, usually minimum, distance "d" has been reached. This action provides formation 50 with sub-portions 52 having a thickness $t_1$, and sub-portions 54, having a thickness $t_2$. Thicknesses "$t_1$" and "$t_2$" may be any thickness desired, dependent upon the application. Thereafter, formation 50 is solidified by exposing the same to the appropriate curing agent, e.g., energy, such as electromagnetic radiation, thermal energy or the like, depending upon the imprinting material. This causes the imprinting material to polymerize and cross-link. The entire process may occur at ambient temperatures and pressures, or in an environmentally controlled chamber with desired temperatures and pressures. In this manner, formation 50 is solidified to provide side 56 thereof with a shape conforming to a shape of a surface 58 of mold 36.

Figure 3:
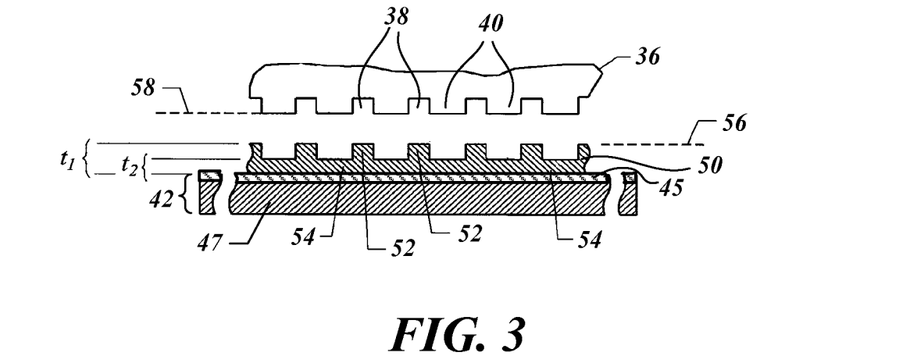
FIG. 3 is a simplified elevation view of the template and substrate, shown in FIG. 2, with the imprinting material being shown as patterned and solidified upon the layer.

Referring to FIGS. 1, 2 and 3, the characteristics of the imprinting material are important to efficiently pattern substrate 42 in light of the unique patterning process employed. For example, it is desired that the imprinting material have certain characteristics to facilitate rapid and even filling of the features of mold 36 so that all thicknesses $t_1$ are substantially uniform and all thicknesses $t_2$ are substantially uniform. To that end, it is desirable that the viscosity of the imprinting material be established, based upon the deposition process employed, to achieve the aforementioned characteristics. As mentioned above, the imprinting material may be deposited on substrate 42 employing various techniques. Were the imprinting material deposited as a plurality of discrete and spaced-apart droplets 46, it would be desirable that a composition from which the imprinting material is formed have relatively low viscosity, e.g., in a range of 0.5 to 20 centipoise (cP). Considering that the imprinting material is spread and patterned concurrently, with the pattern being subsequently solidified into formation 50 by exposure to radiation, it would be desired to have the composition wet surface of substrate 42 and/or mold 36 and to avoid subsequent pit or hole formation after polymerization. Were the imprinting material deposited employing spin-coating techniques, it would be desired to use higher viscosity materials, e.g., having a viscosity greater than 10 cP and typically, several hundred to several thousand cP, with the viscosity measurement being determined in the absence of a solvent.

In addition to the aforementioned characteristics, referred to as liquid phase characteristics, it is desirable that the composition provides the imprinting material with certain solidified phase characteristics. For example, after solidification of formation 50, it is desirable that preferential adhesion and release characteristics be demonstrated by the imprinting material. Specifically, it is beneficial for the composition from which the imprinting material is fabricated to provide formation 50 with preferential adhesion to substrate 42 and preferential release of mold 36. In this fashion, reduced is the probability of distortions in the recorded pattern resulting from the separation of mold 36 therefrom due to, inter alia, tearing, stretching or other structural degradation of formation 50.

The constituent components of the composition that form the imprinting material to provide the aforementioned characteristics may differ. This results from substrate 42 being formed from a number of different materials. As a result, the chemical composition of surface 44 varies dependent upon the material from which substrate 42 is formed. For example, substrate 42 may be formed from silicon, plastics, gallium arsenide, mercury telluride, and composites thereof. As mentioned above, substrate 42 may include one or more layers shown as primer layer 45, e.g., dielectric layer, metal layer, semiconductor layer, planarization layer and the like, upon which formation 50 is generated. To that end, primer layer 45 would be deposited upon a wafer 47 employing any suitable technique, such as chemical vapor deposition, spin-coating and the like. Additionally, primer layer 45 may be formed from any suitable material, such as silicon, germanium and the like. Additionally, mold 36 may be formed from several materials, e.g., fused-silica, quartz, indium tin oxide diamond-like carbon, MoSi, sol-gels and the like.

It has been found that the composition from which formation 50 is generated may be fabricated from several different families of bulk materials. For example, the composition may be fabricated from vinyl ethers, methacrylates, epoxies, thiolenes and acrylates, etc.

An exemplary bulk material from which to form formation 50 is as follows:

Bulk Imprinting Material isobornyl acrylate
n-hexyl acrylate
ethylene glycol diacrylate
2-hydroxy-2-methyl-1-phenyl-propan-1-one

The acrylate component, isobornyl acrylate (IBOA), has the following structure:

and comprises approximately 47% of bulk material by weight, but may be present in a range of 20% to 80%, inclusive. As a result, the mechanical properties of formation 50 are primarily attributable to IBOA. An exemplary source for

IBOA is Sartomer Company, Inc. of Exton, Pa. available under the product name SR 506.

The component n-hexyl acrylate (n-HA) has the following structure:

and comprises approximately 25% of bulk material by weight, but may be present in a range of 0% to 50%, inclusive. Also providing flexibility to formation 50, n-HA is employed to reduce the viscosity of the prior art bulk material so that bulk material, in the liquid phase, has a viscosity in a range 2-9 Centipoises, inclusive. An exemplary source for the n-HA component is the Aldrich Chemical Company of Milwaukee, Wis.

A cross-linking component, ethylene glycol diacrylate, has the following structure:

and comprises approximately 25% of bulk material by weight, and may be present in a range of 10% to 50%, inclusive. EGDA also contributes to the modulus and stiffness buildup, as well as facilitates cross-linking of n-HA and IBOA during polymerization of the bulk material.

An initiator component, 2-hydroxy-2-methyl-1-phenyl-propan-1-one is available from Ciba Specialty Chemicals of Tarrytown, N.Y. under the trade name DAROCUR® 1173, and has the following structure:

and comprises approximately 3% of the bulk material by weight, and may be present in a range of 1% to 5%, inclusive. The electromagnetic radiation to which the initiator is responsive is broad band ultra-violet energy generated by a medium-pressure mercury lamp. In this manner, the initiator facilitates cross-linking and polymerization of the components of the bulk material.

Figure 4:
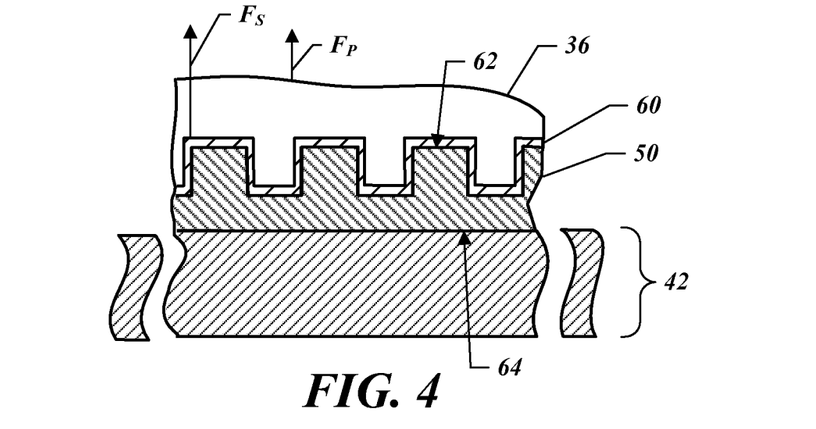
FIG. 4 is a cross-sectional view of the template contacting imprinting material demonstrating the formation of the weak boundary lamella between solidified imprinting material and a template.

In co-pending U.S. Patent Application Publication No. 20060111454, entitled "Composition to Reduce Adhesion Between a Conformable Region and a Mold," to Xu et al., which is incorporated by reference herein, it has been disclosed that desirable preferential adhesion and release properties, as discussed above, may be achieved by producing a weak boundary layer, lamella 60, between mold 36, surface 58 and formation 50, shown in FIGS. 3 and 4. Lamella 60 remains after solidification of the imprinting material. As a result, the adhesion forced between mold 36 and formation 50 are minimal. To that end, it was found to be beneficial to employ a composition for the imprinting material that includes one of several compositions, such as the BULK IMPRINTING MATERIAL discussed above, along with a component that contains low surface energy groups, referred to as a surfactant component and fully described in U.S. Patent Application Publication No. 20060111454.

Figure 5:
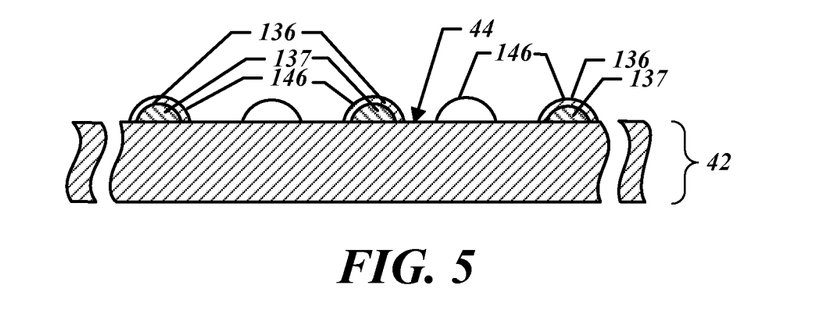
FIG. 5 is a detailed view of the droplets of imprint material, shown in FIG. 2, showing the bifurcation of the droplets into surfactant-rich regions and surfactant-depleted regions.

Referring to FIG. 5, after deposition of the imprinting material, the surfactant component rises, after a period of time, to the air liquid interface, providing droplets 146 of imprinting material with a bifurcated concentration of materials. In a first portion, droplets 146 include a higher concentration of the surfactant component, referred to as a surfactant-component-rich (SCR) sub-portion 136, than the second portion, referred to as a surfactant-component-depleted (SCD) sub-portion 137. SCD sub-portion 137 is positioned between surface 44 and SCR sub-portion 136. SCR sub-portion 136 attenuates the adhesion forces between mold 36 and the imprinting material, once the imprinting material is solidified. Specifically, the surfactant component has opposed ends. When the imprinting material is in the liquid phase, i.e., polymerizable, one of the opposed ends has an affinity for the bulk material included in the imprinting material. The remaining end has a fluorine component.

Referring to FIGS. 4 and 5, as a result of the affinity for the bulk material, the surfactant component is orientated so that the fluorine component extends from an air-liquid interface defined by the imprinting material and the surrounding ambient.

Upon solidification of the imprinting material, a first portion of the imprinting material generates a lamella 60 and a second portion of the imprinting material is solidified, i.e., polymeric material shown as formation 50. Lamella 60 is positioned between formation 50 and mold 36. Lamella 60 results from the presence and location of the fluorine components in the SCR sub-portion 136. Lamella 60 prevents strong adhesion forces from being developed between mold 36 and formation 50. Specifically, formation 50 has first and second opposed sides 62 and 64. Side 62 adheres to mold 36 with a first adhesion force. Side 64 adheres to substrate 42 with a second adhesion force. Lamella 60 results in the first adhesion force being less than the second adhesion force. As a result, mold 36 may be easily removed from formation 50 while minimizing distortions and/or the force required to separate mold 36 therefrom. Although formation 50 is shown with side 62 being patterned, it should be understood that side 62 may be smooth, if not planar.

Figure 6:
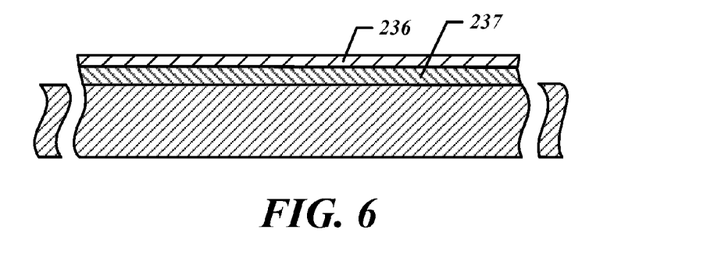
FIG. 6 is a detailed view of a layer of imprinting material, deposited employing spin-on techniques, showing the bifurcation of the layer into surfactant-rich regions and surfactant-depleted regions.

Furthermore, if desired, it is possible to generate lamella 60 so as to be disposed between formation 50 and substrate 42. This may be achieved, for example, by applying imprinting material to mold 36 and subsequently contacting substrate 42 with the imprinting material on mold 36. In this manner, it can be said that formation 50 will be disposed between lamella 60 and the body, e.g., mold 36 or substrate 42, upon which the polymerizable material is deposited. It should be understood that were the imprinting material deposited employing spin-coating techniques, similar bifurcated concentration of materials occurs, as shown in FIG. 6 with respect to SCR sub-portion 236 and second and SCD sub-portion 237. The time required for the bifurcation is dependent upon several factors, including the size of molecules in the composition and the viscosity of the composition. Only a few seconds is needed to achieve the aforementioned bifurcation of composition with viscosity below 20 cP. Material with viscosity in the hundreds of cP, however, may require a few seconds to several minutes.

It has been discovered, however, that lamella 60 may not be uniform. Some regions of lamella 60 are thinner than others, and in some extreme cases, lamella 60 may be absent in an extremely small percentage of the template surface so that template 36 is in contact with formation 50. As a result of the thinner regions of lamella 60 and in the absence of lamella 60, distortion and/or delamination of formation 50 from substrate 42 may occur. Specifically, upon separation of mold 36, formation 50 is subjected to a separation force $F_S$. Separation force $F_S$ is attributable to a pulling force $F_P$ on mold 36 and adhering forces, e.g., Van der Waals forces, between formation 50 and mold 36 as reduced by lamella 60. Due to the presence of lamella 60 separation force $F_S$ typically has a magnitude that is less than the magnitude of an adhering force $F_A$ between formation 50 and substrate 42. However, with the reduction, or absence, of lamella 60, local separation force $F_S$ may approach the magnitude of local adhering force $F_A$. By local forces what is meant are the forces present in a given region of lamella layer 60, which in this example are the local forces proximate to a thin region of lamella layer 60 or where lamella layer 60 is substantially absent. This leads to distortion and/or delamination of formation 50 from substrate 42.

Figure 7:
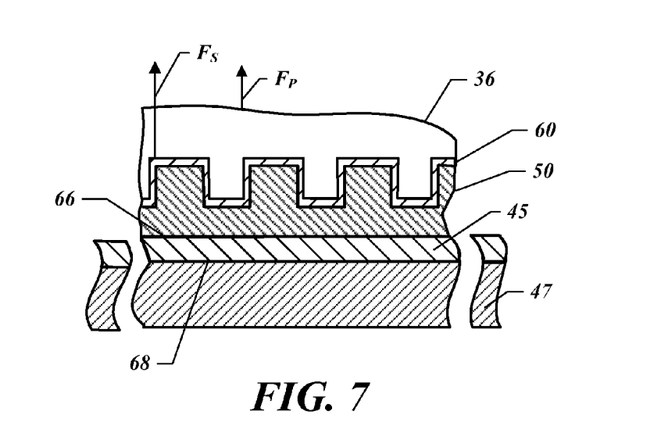
FIG. 7 is a cross-sectional view of the template contacting solidified imprinting material, deposited as shown in either FIG. 5 or 6, formed on a substrate including a primer layer.

Referring to FIG. 7, in the presence of primer layer 45, a more complex situation exists due to the presence of two interfaces 66 and 68. At a first interface 66 a first adhering force $F_1$ is present between primer layer 45 and formation 50. At a second interface 68 a second adhering force, $F_2$, is present between primer layer 45 and wafer 47. It is desired that the separation force $F_S$ have a magnitude that is less than either adhering forces $F_1$ and $F_2$. However, due to variations in the thickness, or absence, of lamella 60, as discussed above, separation force $F_S$ may be similar or approach the magnitude of one or both of adhering forces $F_1$ and $F_2$. This may cause delamination of formation 50 from primer layer 45, primer layer 45 from wafer 47 or both.

The present invention reduces, if not avoids, the delamination problem mentioned above by forming primer layer 45 from a material that increases the probability that first $F_1$ and second $F_2$ adhering forces of the first and second interface, respectively, are greater than the separation force $F_S$ in view of lamella layer fluctuations. To that end, primer layer 45 is formed from a composition that forms strong bonds at interface 66, i.e., between primer layer 45 and formation 50, as well as, i.e., between interface 66, primer layer 45 and wafer 47. The composition may include one or more components. In some embodiments, the composition includes one component and moisture ($H_2O$) from the atmosphere that may be used, for instance, in a hydrolysis reaction. In the present example, adhesion between primer layer 45 and formation 50 at first interface 66 is the result of covalent bonding, i.e., covalent bonds between the composition from which primer layer 45 is formed and the composition from which formation 50 is formed are present. Adhesion between primer layer 45 and wafer 47 may be achieved through any one of various mechanisms. These mechanisms may include covalent bonds formed between the composition from which primer layer 45 is formed and the material from which wafer 47 is formed. Alternatively, or in addition to, the covalent bonds, ionic bonds may be formed between the composition from which primer layer 45 is formed and the material from which wafer 47 is formed. Alternatively, or in addition to, the covalent bonds, and/or the ionic bonds or both, adhesion between the composition from which primer layer 45 is formed and the material from which wafer 47 is formed may be achieved vis-à-vis Van der Waals forces.

This is achieved by forming adhesion primer layer 45 from a composition that includes one or more components generally represented as follows:

Compositions for the adhesion primer layer may include components I, II, or III or combinations thereof. Components I, II, and III include a first end, a second end, and a linker group (R, R', R"). For instance, in components I and II, the first end may be thought of as including $YX_nZ_{3-n}$, while the first end of component III may be thought of as including W. Similarly, in Components I and III, the second end may be thought of as including X'.

In components I and III above, X' is a functional group that may bond covalently with the imprinting monomer (polymerizable material) during activation such as, for instance, UV irradiation. For an acrylate based imprinting monomer, X' may be, for instance, an acrylic group or a methacrylic group.

In components I, II, and III above, Y is a tetravalent atom including, but not limited to, Si, and X is a functional group (for instance, a leaving group) which allows the Y—X bond to be hydrolyzed to Y—OH. The hydroxyl group may subsequently react with the imprinting substrate to form a covalent bond with the substrate. In embodiments in which Y is Si, X may be, for instance —$OCH_3$, —$OCH_2CH_3$, —Cl, —OC(=O)$CH_3$, etc. In components I, II, and III, n and m range from 1 to 3, inclusive. A higher number of leaving groups (for instance, n=3 and/or m=3) may allow for multiple bonding to a substrate (for instance, a surface of a substrate) and/or to other molecules in the adhesion primer layer, increasing the strength of adhesion of the adhesion primer layer to the surface of the substrate.

In components I, II, and III above, Z is generally an unreactive group which fulfills the tetravalent requirement of Y. In some embodiments, Z may be, for instance, a methyl group.

In components I, II, and III above, W is an acidic functional group that may react or interact with imprinting substrate. In some embodiments, W is, for instance, carboxylic acid or phosphoric acid, etc.

In components I, II, and III above, R, R', and R" are linker groups with different lengths. Typical linkers are hydrocarbon based. The linker groups may include, for instance, 1-10 or more carbons atoms (alkyl groups, ethylenically unsaturated groups, aromatic groups). A linker group may be chosen for a variety of factors including, but not limited to length, rigidity, and/or bond strength(s) of the linker group In components I and II above, X is selected to achieve cross-reaction of an end of component I and II (for instance, the first end) with the material from which substrate 42 is formed to adhere thereto by forming a covalent bond therewith, ionic bond therewith, and/or Van der Waals forces with the surface of the substrate. This may be achieved directly or indirectly. That is, if X is a leaving group, X does not directly react with the surface of the substrate. In this embodiment, a chemical reaction involving the leaving of X allows Y to chemically react to form a covalent bond with the surface of the substrate.

In some embodiments, functional groups X may participate in the cross-linking and polymerization reactions of adhesion primer layer 45. X functional groups may facilitate polymerization and cross-linking in response to an activation energy that differs from the activation energy in response to which X' functional groups cross-react. The X functional groups may facilitate cross-linking of molecules in primer layer 45 in response to exposure to thermal energy. Functional groups X are selected to facilitate cross-reaction with substrate 42 through mechanisms including but not limited to: 1) direct reaction with material from which substrate 42 is formed; 2) reaction with cross-linker molecules with a linking functional group of the cross-linker reacting with substrate 42; 3) polymerization of and cross-linking of primer layer 45 so that chains of molecules of sufficient length may be developed to connect between formation 50 (polymeric layer) and surface of substrate 42; and 4) leaving of X to allow Y to achieve 1-3 above, which allows the polymeric layer to adhere to the surface of the substrate.

In components I and III above, X' is selected to achieve cross-reaction with the polymerizable material from which formation 50 (polymeric layer) is formed to form a covalent bond therebetween. The functionality of the X' group is established so the cross-reaction occurs during polymerization of formation 50. As a result, the selection of functional group X' depends upon the characteristics of the polymerizable material from which formation 50 (polymeric layer) is formed. In some embodiments, X' is chosen to react with the functional groups of the composition from which formation 50 is formed. For example, were formation 50 formed from acrylate monomers, X' may include acrylic, vinyl ether, and or methacrylic groups, and/or functional groups that may copolymerize with acrylic groups in formation 50. As a result, X' functional groups cross-react in response to activation such as, for instance, ultraviolet radiation.

Figure 8:
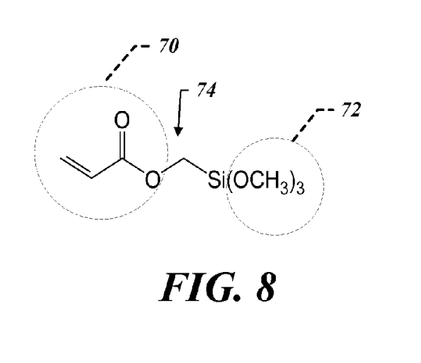
FIG. 8 is a plan view showing the chemical structure of a component that may be used to form an adhesion primer layer.

Referring to FIGS. 7 and 8, an exemplary multi-functional reactive compound A that may be employed to form primer layer 45 in the presence of formation 50 being formed from BULK MATERIAL includes acryloxymethyltrimethoxysilane (Gelest, Inc., Morristown, Pa.). Acryloxymethyltrimethoxysilane has the following structure:

The X' functional group 70 provides acrylic functionality for bonding with imprinting material. The X functional group 72 (n=3), is a methoxy leaving group bound to Y (tetravalent Si). Functional groups 70 and 72 are coupled to opposing ends of a backbone component or linker group 74.

Acryloxymethyltrimethoxysilane, with a flash point of about 60° C., has a boiling point of about 170° C., or about 20° C. lower than the boiling point of tridecafluoro-1,1,2,2-tetrahydrooctyltrichlorosilane (FOTS) self-assembling monolayer (SAM), which is known in the art to be vapor depositable. It may be desirable to keep the boiling temperature low while meeting all the adhesion requirements, thus facilitating the vapor deposition process.

As shown in FIG. 8, backbone component 74 includes one carbon atom. A short backbone component may hold the X' and X functional groups together more securely, requiring more energy to break the X' and X functional groups apart during mold separation. Therefore, a shorter backbone component may provide a stronger adhesion primer layer and may therefore a stronger bond between the polymerized material and the substrate than a longer backbone component. In some embodiments, acryloxymethyltriethoxysilane may be used as multi-functional reactive compound I.

Figure 9:
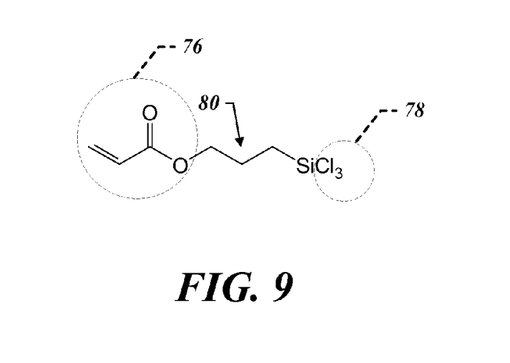
FIG. 9 is a plan view showing the chemical structure of another component that may be used to form an adhesion primer layer.

Referring to FIGS. 7 and 9, another multi-functional reactive compound I that may be employed to form primer layer 45 in the presence of formation 50 being formed from BULK MATERIAL includes acryloxypropyltrichlorosilane (Gelest, Inc.) that has the following structure:

The X' functional group 76 provides acrylic functionality for bonding with imprinting material. The X functional group 78 (n=3) includes three —Cl leaving groups bound to Y (tetravalent Si). Functional groups 76 and 78 are coupled to opposing ends of a backbone component 80. Backbone component 80 includes three carbon atoms.

Figure 10:
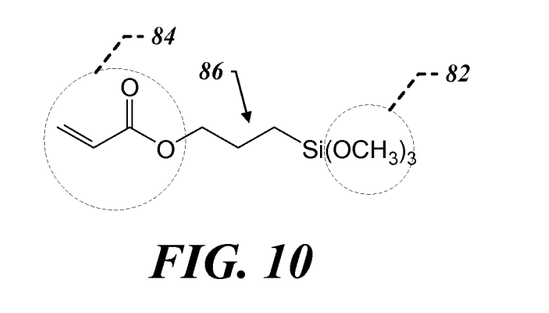
FIG. 10 is a plan view showing the chemical structure of another component that may be used to form an adhesion primer layer.

Referring to FIGS. 7 and 10, another multi-functional reactive compound I that may be employed to form primer layer 45 in the presence of formation 50 being formed from BULK MATERIAL includes acryloxypropyltrimethoxysilane (Aldrich; Milwaukee, Wis.) that has the following structure:

The X' functional group 82 provides acrylic functionality for bonding with imprinting material. The X functional group 84 (n=3) includes three methoxy leaving groups bound to Y (tetravalent Si). Functional groups 82 and 84 are coupled to opposing ends of a backbone component 86. Backbone component 86 includes three carbon atoms.

Figure 11:
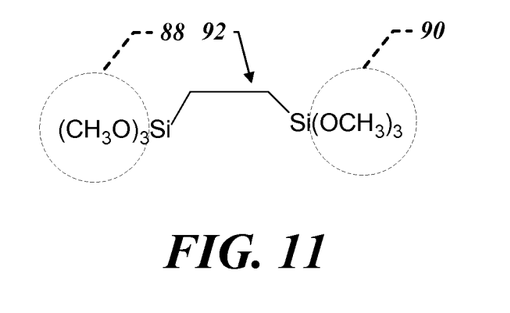
FIG. 11 is a plan view showing the chemical structure of another component that may be used to form an adhesion primer layer.

Referring to FIGS. 7 and 11, a multi-functional reactive compound II that may be employed to form primer layer 45 in the presence of formation 50 being formed from BULK MATERIAL includes 1,2-bis(trimethoxysilyl)ethane (Aldrich) that has the following structure:

The X functional groups 88 (m=3) and 90 (n=3) include three methoxy leaving groups bound to Y (tetravalent Si). Functional groups 88 and 90 are coupled to opposing ends of a backbone component 94. Backbone component 94 includes two carbon atoms.

Figure 12:
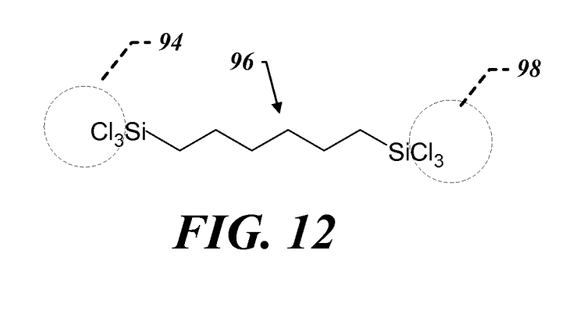
FIG. 12 is a plan view showing the chemical structure of another component that may be used to form an adhesion primer layer.

Referring to FIGS. 7 and 12, a multi-functional reactive compound II that may be employed to form primer layer 45 in the presence of formation 50 being formed from BULK MATERIAL includes 1,6-bis(trichlorosilyl)hexane (Aldrich) that has the following structure:

The X functional groups 94 (m=3) and 96 (n=3) include three —Cl leaving groups bound to Y (tetravalent Si). Functional groups 94 and 96 are coupled to opposing ends of a backbone component 98. Backbone component 98 includes six carbon atoms.

In some embodiments, III may be, for example, acrylic acid (Aldrich), with the following structure:

In an embodiment, components I, II, and/or III in the fluid state are contacted with a substrate during a coating process to adhere an adhesion primer layer on the substrate. The coating process may include any dip-coating or chemical vapor deposition process known in the art. An adhesion primer layer may include, for instance, I but not II and III; III but not I and II; I and II but not III; I and III but not II; or I, II, and III. When II is used along with I, the X functionality in II allows II to serve as a chain extender for co-polymerization of I and II.

In an embodiment, a component of an adhesion primer layer is contacted with a surface of a substrate. Initiation of a chemical reaction between the primer layer composition and the substrate can allow a first end of component I and/or component II and/or the W functional group of component III to bond (for instance, covalently, ionically, or through Van der Waals forces) to the substrate. In certain embodiments, for instance when the a primer layer components include acryloxymethyltrimethoxysilane or acryloxypropyltrimethoxysilane, the components bond to each other (as well as the substrate), to form a networked polymer coating on the surface of the substrate. In embodiments in which the primer layer components include I and II, co-polymerization of I and II may enhance the networked polymer coating.

Initiation of the chemical reaction may be achieved, for instance, through heating of the primer layer composition and/or substrate. In some embodiments, a method of initiating the chemical reaction between the primer layer composition and the substrate (for instance, between a first end of component I and/or component II after removal of leaving group(s) X) and/or a first end (W) of component III and the surface of the substrate), does not affect the X' functionality of components of the primer layer composition. For instance, heating of the primer layer composition may cause bonding of a first end of components I, II, or III to a surface of a substrate, directly or indirectly through functional groups, without causing a reaction of a second end of components I or III (that is, without altering the X' functionality).

In some embodiments, the X' functionality reacts during a step in an imprint lithography process. For example, the X' functionality may react during UV exposure or irradiation of the imprinting material, such that the X' functionality of components of the primer layer composition reacts to form covalent bonds with the monomer in the polymerizable imprinting material during polymerization to facilitate strong adhesion between the polymeric layer (formed from the polymerizable material) and the substrate.

Vapor deposition of an adhesion primer layer may be achieved through any chemical vapor deposition method known in the art. For instance, vapor deposition may be achieved in a vacuum oven or with a track type tool compatible with a semiconductor manufacturing process. In some embodiments, an adhesion primer layer composition may be vaporized by heating during a vapor deposition process. In other embodiments, an adhesion primer layer composition may be vaporized by a combination of heating and reduced pressure during a vapor deposition process. Yet in other embodiments, an adhesion primer layer composition may be vaporized by bubbling the composition with a carrier gas such as nitrogen or argon. A boiling point of an adhesion primer layer composition at ambient pressure may be, for instance, less than about 350° C. In some embodiments, a boiling temperature of an adhesion primer layer composition may be less than about 250° C. A deposition temperature may be lower than the boiling point of the adhesion primer layer composition in a reduced pressure environment or with a gas bubbling technique.

In some embodiments, an adhesion primer layer may be adhered to one surface of a substrate by chemical vapor deposition. In other embodiments, an adhesion primer layer may be adhered simultaneously to two or more surfaces of a substrate through chemical vapor deposition. A substrate may be positioned on, for instance, a pin lift to allow vapor to contact two or more surfaces of a substrate substantially simultaneously without turning or repositioning the substrate between coating of a first surface and a second surface of the substrate. Thus, vapor deposition of an adhesion primer layer may allow batch processing of substrates, thereby reducing the processing time required for wafer-to-wafer spin-coating processes conventionally used to deposit adhesion primer layers.

Additionally, vapor deposition of an adhesion primer layer may allow two or more surfaces of substrate to be coated with an adhesion primer layer without particle contamination caused during physical contact of a substrate and spin-coating apparatus, for instance, a spin chuck, during a spin-coating process. Adhesion primer layers may be vapor deposited on two surfaces of a substrate that are substantially parallel. Thus, vapor deposition of an adhesion primer layer will facilitate manufacturing of double-sided media, including magnetic media. Examples of double-sided media may include, for instance, compact discs, digital video discs, and hard discs.

Components of an adhesion primer layer composition may be chosen for factors including, but not limited to, functionality (multi-functional or mono-functional), linker group length, linker rigidity, link bond strength(s), pH, cross-linking density, reactivity, shelf life and/or stability, and boiling temperature. The strength of the adhesion layer may be limited by properties of the linker group (for instance, the weakest bond in the linker group). Thus, a component may be chosen to have a short linker with a strong bond between X and X' functionalities. In some embodiments, a strong linker bond (for instance, some aromatic groups) may result in a high boiling point, which increases the difficulty of vapor deposition.

Experiments were performed to evaluate adhesive properties of various adhesion primer layer compositions on a variety of substrates, including $Si_xN_y$, $SiO_2$, and Si. Adhesive properties of adhesion primer layer compositions described below were assessed for various dip coating processes and spin coating, allowing comparison of substrate adhesion of the compositions.

COMPOSITION 1 is a 0.1% solution of acryloxymethyltrimethoxysilane (shown in FIG. 8) in isopropanol. This composition was applied by dip coating.

COMPOSITION 2 is a 0.1% solution of acryloxypropyltrimethoxysilane (APTMS) (shown in FIG. 10), in isopropanol. This composition was applied by dip coating.

COMPOSITION 3 is DUV30J-16, a bottom anti-reflective coating (BARC) (Brewer Science, Rolla, Mo.). DUV30J-16 contains phenolic resins, and its cross-linker can react with carboxylic functional groups. It is believed that DUV30J-16 will not form covalent bonds with formation 50.

COMPOSITION 4 includes approximately 77 grams of IsoRad 501 (available from Schenectady International, Inc. in Schenectady, N.Y.), 22 grams of Cymel 303ULF (Cytec Industries, Inc.; West Patterson, N.J.) and one gram of Cycat 4040 (Cytec Industries, Inc.). IsoRad 501, Cymel 303ULF and Cycat are combined. The combination of IsoRad 501, Cymel 303ULF and Cycat is then introduced into approximately 1900 grams of PM Acetate. PM Acetate is a product name of a solvent consisting of 2-(1-methoxy)propyl acetate (Eastman Chemical Company; Kingsport, Tenn.).

Glass slides, approximately 1 mm thick, 75×25 mm in the lateral dimension, were dip-coated with COMPOSITIONS 1-2 to generate comparative data of the strength of the adhesion forces of interfaces 66 and 68. Before deposition of primer layer 45 and formation 50 the glass slides are cleaned. Specifically each glass slide is exposed to Piranha solution ($H_2SO_4:H_2O_2=2:1$ by volume). The glass slides are subsequently rinsed with de-ionized water, sprayed with isopropyl alcohol, and exposed to a stream of fluid for drying, e.g., a stream of nitrogen gas. Thereafter, the glass slides are baked at 120° C. for 2 hours.

COMPOSITIONS 1-2 are deposited onto glass slides employing dip-coating techniques known in the art. COMPOSITIONS 3-4 are deposited onto glass slides employing spin-coating techniques known in the art. For COMPOSITIONS 1 and 2, primer layer 45 is dried on the glass slides on hot plates at 80° C. for 10 minutes. For COMPOSITION 3, primer layer 45 is dried on the glass slides on hot plates at 180° C. for 2 minutes. For COMPOSITION 4, primer layer 45 is dried on the glass slides on hot plates at 150° C. for 5 minutes. In other words, dip- and spin-coated COMPOSITIONS 1-4 are solidified, i.e., polymerized and cross-linked, by exposure to thermal energy. After the primer layer is dried, a drop of BULK IMPRINTING MATERIAL is applied to a center of a coated side of a first glass slide.

The BULK IMPRINTING MATERIAL is then sandwiched between two primer layers 45 by having the primer layer on the two glass slides facing one another and contacting BULK IMPRINTING MATERIAL. Typically a longitudinal axis of one of the two glass slides extends orthogonally to the longitudinal axis of the remaining glass slide to form a "t" shape, with an overlapping area of about 25×25 mm. The BULK IMPRINTING MATERIAL is solidified, i.e., polymerized, and cross-linked by exposing the two glass slides to actinic energy, such as broad band ultraviolet wavelengths, using a medium pressure mercury UV lamp for 40 seconds at 20 mW/cm² intensity.

To measure the strength of the adhesion, a four-point bending fixture was adopted for the adhesion test and technique, similar to that described in "Measurement of Adhesive Force Between Mold and Photocurable Resin in Imprint Technology" Japanese Journal of Applied Physics, Vol. 41 (2002) pp. 4194-4197. The maximum force/load was taken as the adhesion value. In the cases in which one of the glass slides broke before delamination occurred or before the glass slides separated, the maximum force/load was taken as the minimum adhesion value. The beam distance of the top and bottom two points is 60 mm. The load was applied at the speed of 0.5 mm per minute.

Using the four-point bending adhesion test described above, COMPOSITIONS 2 and 3 demonstrated similar adhesion values of about 4 lbf. Under the same testing, COMPOSITIONS 1 and 4 resulted in broken slide(s) before the true adhesion was measured. Adhesion at the time of breaking (minimum adhesion) was measured to be about 12 lbf. Thus, COMPOSITIONS 1 and 4 demonstrated adhesion of at least about 3 times stronger than the adhesion of COMPOSITIONS 2 and 3 under similar conditions.

After preliminary dip-coating tests, acryloxymethyltrimethoxysilane (from COMPOSITION 1) was vapor deposited by bubbler and heating methods. Adhesion properties of vapor-deposited acryloxymethyltrimethoxysilane were compared to adhesion properties of spin-coated COMPOSITION 4. This demonstration utilized 65 mm glass discs as supplied by Hitachi Global Storage Technologies (San Jose, Calif.) with 5 nm of surface $Si_xN_y$ coating. Substrates were taken straight from the carrier without precleaning.

In an evaporation method, a 65 mm substrate was set on an aluminum slide, the aluminum slide is partially covered by this substrate, and the aluminum slide was positioned on a hot plate. The hot plate was maintained at 90° C. 3 μL of acryloxymethyltrimethoxysilane was dispensed on the uncovered portion of the aluminum slide. A lid was placed over both the substrate and aluminum slide to retain the vapor generated by heat. The retained vapor was deposited onto the substrates. Substrates were removed after 1 minute, and exposed to ambient conditions for 20 minutes before conducting the adhesion test. Glass rods with a 5 mm diameter were also coated with acryloxymethyltrimethoxysilane in a similar manner.

In a bubbler vapor method, nitrogen was bubbled through 1 mL of acryloxymethyltrimethoxysilane in an 8 mL vial. A lid with a vapor delivery line was placed over the substrate, and the substrate was exposed to vapor for 15-60 sec. Substrates were then exposed to ambient conditions for less than 10 min before conducting the adhesion test. Glass rods with a 5 mm diameter were also coated with acryloxymethyltrimethoxysilane in a similar manner.

In a comparison, COMPOSITION 3 was spin-coated on substrates and exposed to ambient conditions for 20 minutes before conducting the adhesion test. Glass rods with a 5 mm diameter were brush-coated with COMPOSITION 3.

In a comparison, COMPOSITION 4 was spin-coated on substrates and exposed to ambient conditions for 20 minutes before conducting the adhesion test. Glass rods with a 5 mm diameter were brush-coated with COMPOSITION 4.

The adhesion test was conducted by placing a drop of BULK IMPRINTING MATERIAL on the coated substrate, and positioning a coated glass rod on the substrate, such that the glass rod was substantially perpendicular to the lateral plane of the substrate. The imprinting material was cured with ultraviolet radiation. With the glass rod anchored on the substrate, shear testing of the glass rod was performed to assess adhesion of the glass rod to the substrate. That is, the adhesion force was recorded as the force required to shear the glass rod from the substrate.

Shear testing resulted in shear force of about 35 lbf for COMPOSITION 1 (about 37 lbf for the evaporation method and about 33 lbf for the bubbler method), and and 10 lbf for spin-coated COMPOSITION 3. Although the shear force of COMPOSITION 1 is about 3.5 times the shear force of COMPOSITION 3, the true adhesion in the form of the peel of COMPOSITION 1 is more than 3.5 times of that of COMPOSITION 3 once the friction forces is removed from the shear force.

Shear testing resulted in shear force of about 30-40 lbf for the spin-coated COMPOSITION 4.

The embodiments of the present invention described above are exemplary. Many changes and modifications may be made to the disclosure recited above, while remaining within the scope of the invention. Therefore, the scope of the invention should not be limited by the above description, but instead should be determined with reference to the appended claims along with their full scope of equivalent.

What is claimed is:

1. A method comprising:
    (a) contacting a substrate with a multi-functional component, wherein the multi-functional component comprises a first end, a second end, and a linker group between the first end and the second end, wherein the first end comprises a tetravalent atom and the linker group is —$CH_2$—;
    (b) covalently bonding the tetravalent atom of the first end of the multi-functional component to the substrate to form an adhesion primer layer;
    (c) disposing a polymerizable imprinting material on the adhesion primer layer; and
    (d) covalently bonding the second end of the multi-functional component to the polymerizable imprinting material during polymerization of the polymerizable imprinting material in an imprint lithography process.

2. The method of claim 1, wherein the multi-functional component has a boiling point that is at most about 350° C.

3. The method of claim 1, wherein the multi-functional component has a viscosity that is at most about 100 cP.

4. The method of claim 1, wherein the tetravalent atom is silicon.

5. The method of claim 1, wherein the multi-functional component is acryloxymethyltrimethoxysilane.

6. The method of claim 1, wherein the multi-functional component is acryloxymethyltriethoxysilane.

7. The method of claim 1, further comprising contacting the substrate with one or more additional components.

8. The method of claim 7, wherein one of the additional components is 1,2-bis(trimethoxysilyl)ethane.

9. The method of claim 7, wherein one of the additional components is 1,6-bis(trichlorosilyl)hexane.

10. The method of claim 1, wherein the substrate comprises silicon.

11. The method of claim 1, wherein the substrate is chosen from a group consisting of silicon, silicon oxide silicon nitride, tantalum, aluminum, quartz, and fused silica.

12. A compact disc formed according to the method of claim 1.

13. A digital video disc formed according to the method of claim 1.

14. A hard disc formed according to the method of claim 1.

15. The method of claim 1, wherein polymerization of the polymerizable imprinting material comprises UV irradiation of the polymerizable imprinting material.

16. A method comprising:
    (a) contacting a substrate with a multi-functional component and an additional component, wherein the multi-functional component comprises a first end, a second end, and a linker group between the first end and the second end, wherein the first end comprises a tetravalent atom and the linker group is —$CH_2$—, and wherein the additional component is 1,2-bis(trimethoxysilyl)ethane or 1,6-bis(trichlorosilyl)hexane;
    (b) covalently bonding the tetravalent atom of the first end of the multi-functional component to the substrate to form an adhesion primer layer; and
    (c) covalently bonding the second end of the multi-functional component to a polymerizable material during an imprint lithography process.

17. The method of claim 16, wherein the tetravalent atom is silicon.

18. The method of claim 16, wherein the multi-functional component is acryloxymethyltrimethoxysilane.

19. The method of claim 16, wherein the multi-functional component is acryloxymethyltriethoxysilane.

20. The method of claim 16, wherein the substrate comprises silicon.

* * * * *